United States Patent
Mizumasa et al.

(10) Patent No.: US 7,310,507 B2
(45) Date of Patent: Dec. 18, 2007

(54) FILTER CIRCUIT PERMITTING ADJUSTMENT OF CUTOFF FREQUENCY

(75) Inventors: Tatsuhiro Mizumasa, Kawasaki (JP); Koji Nozoe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 513 days.

(21) Appl. No.: 11/043,985

(22) Filed: Jan. 28, 2005

(65) Prior Publication Data

US 2005/0176393 A1    Aug. 11, 2005

(30) Foreign Application Priority Data

Sep. 2, 2004   (JP)   ............................. 2004-255320

(51) Int. Cl.
*H04B 1/06*   (2006.01)
(52) U.S. Cl. ...................... 455/307; 455/340
(58) Field of Classification Search ...................... None
See application file for complete search history.

(56) References Cited

U.S. PATENT DOCUMENTS 3,633,134 A * 1/1972 Barrows et al. ............ 333/192
5,499,392 A * 3/1996 Grunwell .................... 455/260
6,377,788 B1 * 4/2002 Elder et al. ................. 455/266

FOREIGN PATENT DOCUMENTS

| JP | 6-251303 | 9/1994 |
|---|---|---|
| JP | 11-31936 | 2/1999 |
| JP | 2002-176329 | 6/2002 |

* cited by examiner

*Primary Examiner*—Thanh Cong Le
(74) *Attorney, Agent, or Firm*—Arent Fox, LLP.

(57) ABSTRACT

A filter circuit, having a plurality of selectable impedance elements, that has a cutoff frequency dependent on a selected impedance element, comprises a pulse generation circuit that supplies a variable frequency pulse with a successively increasing or decreasing frequency to an input of the filter circuit; and an impedance element selection unit that checks the attenuation of the output pulse of the filter circuit corresponding with the input of the variable frequency pulse and selects the plurality of impedance elements on the basis of the position of a pulse that is attenuated to or below a reference value.

12 Claims, 11 Drawing Sheets

FIG. 1A LPF

FIG. 1B HPF

FILTER CIRCUIT PERMITTING ADJUSTMENT OF CUTOFF FREQUENCY

CROSS-REFERENCE TO RELATED APPLICATIONS

This application is based upon and claims the benefit of priority from the prior Japanese Patent Application No. 2004-255320, filed on Sep. 2, 2004, the entire contents of which are incorporated herein by reference.

BACKGROUND OF THE INVENTION

1. Field of the Invention

The present invention relates to a filter circuit such as a low pass filter or high-pass filter that makes it possible to perform cutoff frequency adjustment easily and to a method of measuring the cutoff frequency of the filter circuit.

2. Description of the Related Art

Varied signal processing such as high-frequency noise removal may be performed by installing a low pass filter or high pass filter, or the like, in an integrated circuit. Low pass filters and high pass filters have a cutoff frequency Fc corresponding with the characteristic value of the impedance element that constitutes the filter. The cutoff frequency Fc is dependent on the capacitance value or resistance value of the impedance element that constitutes the filter circuit. Meanwhile, the circuit elements of the integrated circuit are subject to the influence of structural variations and therefore fluctuations in the characteristic value are unavoidable. Therefore, the filter circuit built in the integrated circuit requires a circuit for tuning the cutoff frequency Fc. For example, Japanese Patent Application Laid Open No. H6-251303, such as FIGS. 1 and 5 and paragraph [0035], for example, describes the setting of the cutoff frequency of a bandpass filter or low pass filter, or the like.

A conventional, general cutoff frequency setting method entails supplying a sine wave with a predetermined frequency to the input of the filter, checking the relationship between the predetermined frequency and the cutoff frequency of the filter by monitoring the output signal of the filter, and then tuning the filter characteristic so that the optimal cutoff frequency is obtained.

However, according to the conventional method above, the step of inputting a sine wave with a predetermined frequency and monitoring the output signal must be repeated for a plurality of frequencies, and there is then the drawback of the large amount of tuning work involved. Further, a high-cost analog signal generation circuit is required to supply a sine wave, which adds to the costs of a tester.

SUMMARY OF THE INVENTION

It is therefore an object of the present invention to provide a low pass filter circuit and high pass filter circuit that make it possible to perform cutoff frequency adjustment easily.

It is a further object of the present invention to provide a cutoff frequency measurement method that allows the cutoff frequency to be detected simply.

In order to achieve the above objects, according to a first aspect of the present invention, a filter circuit, having a plurality of selectable impedance elements, that has a cutoff frequency dependent on a selected impedance element, comprises a pulse generation circuit that supplies a variable frequency pulse with a successively increasing or decreasing frequency to an input of the filter circuit; and an impedance element selection unit that checks the attenuation of the output pulse of the filter circuit corresponding with the input of the variable frequency pulse and selects the plurality of impedance elements on the basis of the position of a pulse that is attenuated to or below a reference value.

According to the first aspect above, in a preferred embodiment, the impedance element selection unit establishes a state where a predetermined impedance element is selected as the initial state and changes the selection state of the impedance element on the basis of a pulse, that is attenuated to or below the reference value, among the output pulse outputted in the initial state.

In order to achieve the above objects, according to a second aspect of the present invention, a method of measuring the cutoff frequency of a filter circuit, that has a cutoff frequency dependent on a built-in impedance element, comprises the steps of supplying a variable frequency pulse with a successively increasing or decreasing frequency to the input of the filter circuit; and checking the attenuation of the output pulse of the filter circuit that corresponds with the input of the variable frequency pulse and detecting the cutoff frequency on the basis of the position of a pulse that is attenuated to or below a reference value.

According to the second aspect, in a preferred embodiment, the method of measuring the cutoff frequency of a filter circuit, wherein the filter circuit comprises a plurality of selectable impedance elements and the cutoff frequency is dependent on the selected impedance element, further comprising the step of: selecting the plurality of impedance elements in accordance with the detected cutoff frequency.

According to the first aspect of the present invention, since a pulse generation circuit that supplies a variable frequency pulse with a successively increasing or decreasing frequency to the filter circuit is provided, the filter circuit is able to select a plurality of impedance elements and tune the filter circuit to the desired cutoff frequency on the basis of the attenuation state of the output pulse of the filter circuit corresponding with the variable frequency pulse.

Further, according to the second aspect of the present invention, by inputting a variable frequency pulse with a successively increasing or decreasing frequency to the input of the filter circuit, the cutoff frequency can be easily detected on the basis of the position of a pulse that is attenuated to or below a reference value among a plurality of pulses of the output pulse.

DESCRIPTION OF THE PREFERRED EMBODIMENTS

An embodiment of the present invention will be described hereinbelow hereinafter with reference to the drawings. However, the technological scope of the present invention is not limited to this embodiment but instead covers the items appearing in the claims and to any equivalents thereof.

Figure 1A:
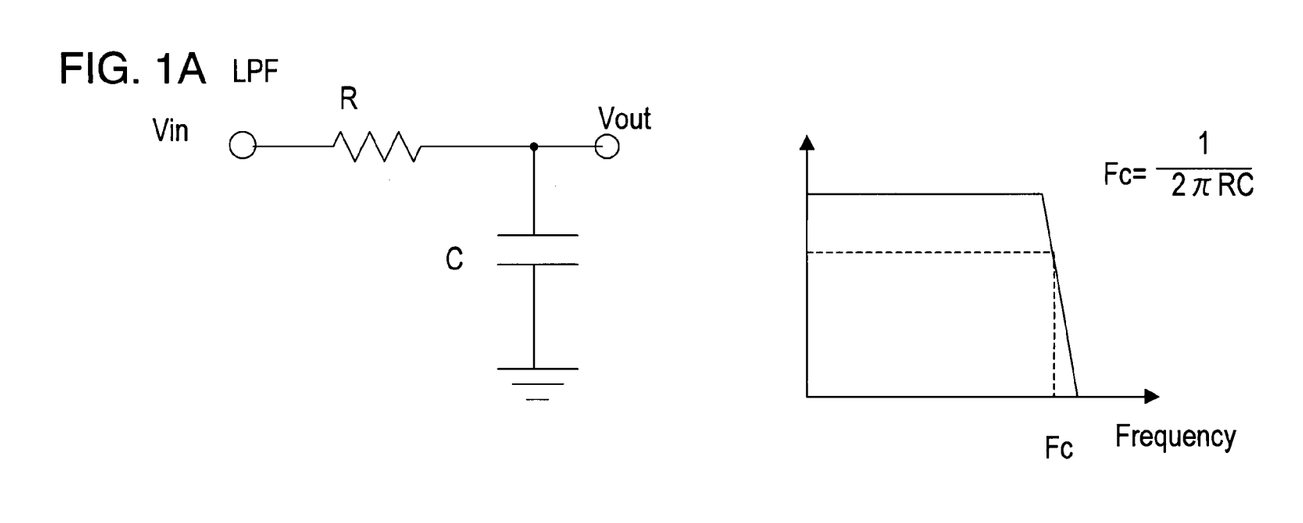
FIG. 1 shows a circuit example and a characteristic example of a general low pass filter and a high pass filter.

FIG. 1 shows a circuit example and characteristic example of a general low pass filter and high pass filter. FIG. 1A shows a circuit example and characteristic example of a low pass filter LPF. A resistor R is connected as an impedance element to an input Vin and a capacitance C is connected between the resistor R and ground. Further, when the input Vin has a low frequency, the impedance $1/j\omega C$ of the capacitance C is large and thus the input signal is outputted to the output Vout without attenuation. When the input Vin has a high frequency, the impedance of the capacitance C is small and the input signal is absorbed and attenuated on the ground side. The cutoff frequency Fc is expressed by $Fc=1/2pRC$.

Figure 1B:
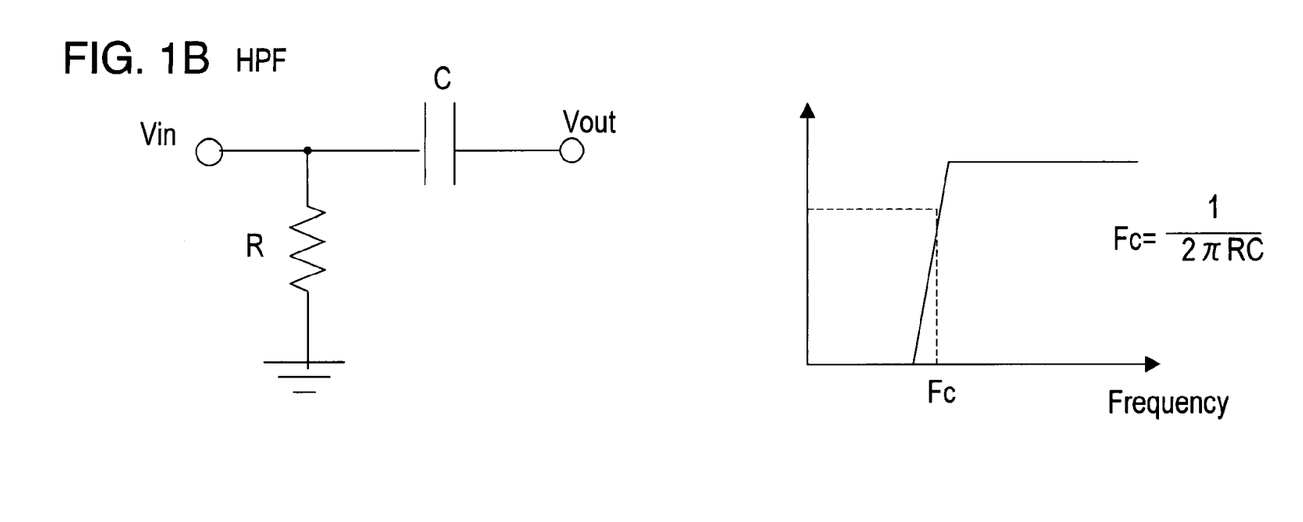

FIG. 1B shows a circuit example and characteristic example of a high pass filter HPF. In the high pass filter circuit, the resistor R and capacitance C are provided as impedance elements at the input Vin. When the input Vin has a low frequency, the impedance of the capacitance C is large and thus the input signal is attenuated and outputted. On the other hand, when the input Vin has a high frequency, the impedance of the capacitance C is small and the input signal is outputted without attenuation. The cutoff frequency Fc is expressed by $Fc=1/2pRC$ in the same way as the low pass filter.

In any filter circuit, the cutoff frequency Fc is determined with dependence on the resistance value and capacitance value of the resistor R and capacitor C respectively, which are the impedance elements. Therefore, in the tuning of the cutoff frequency Fc, the characteristic values of the impedance elements R and C must be tuned.

Figure 2:
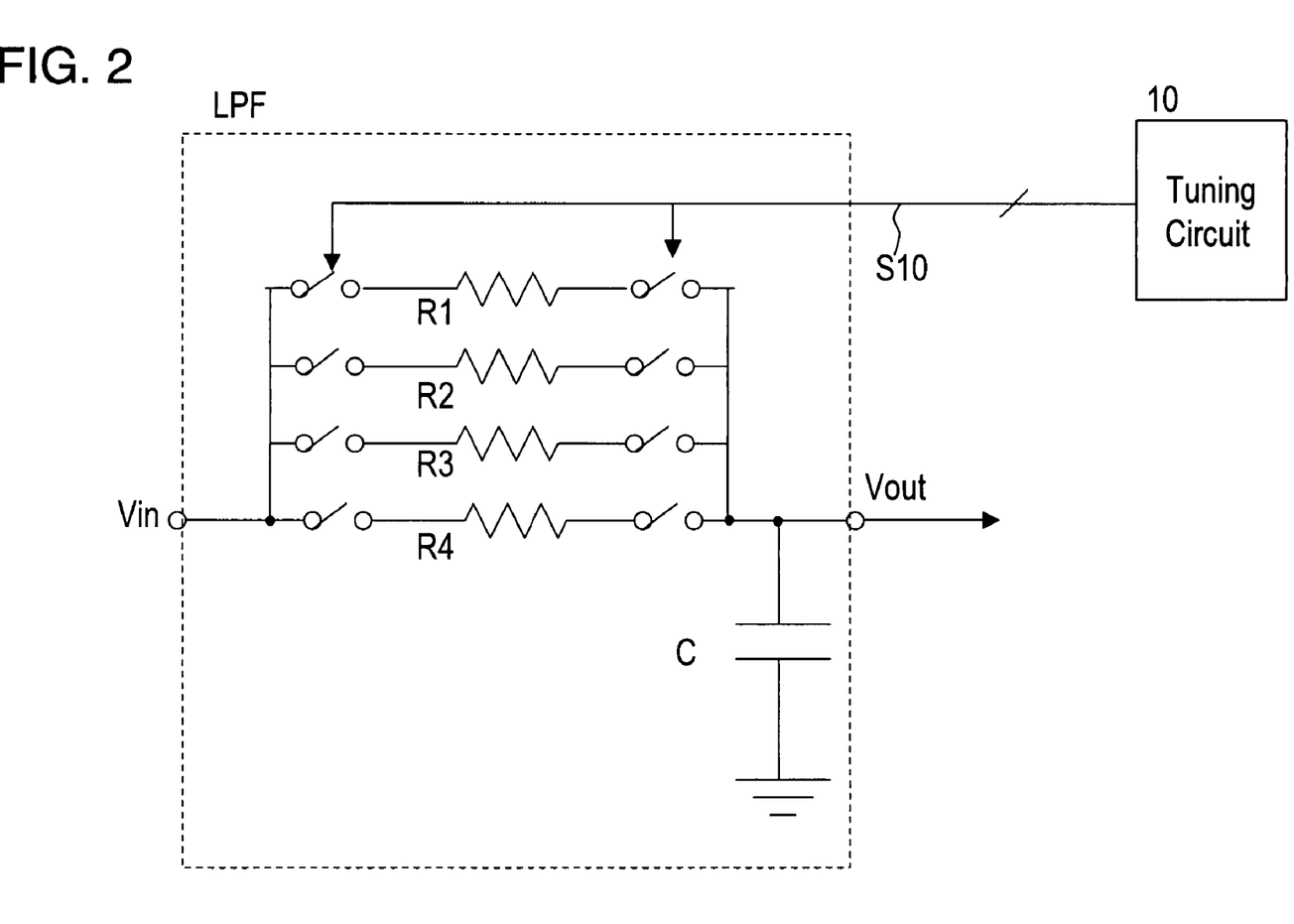
FIG. 2 illustrates a method of tuning the cutoff frequency of a general low pass filter.

FIG. 2 illustrates a method of tuning the cutoff frequency of a general low pass filter. The low pass filter LPF has a plurality of resistors R1 to R4 provided in parallel as impedance elements and the conduction/non-conduction of the switches of the resistor group is controlled by means of a tuning signal S10 of a tuning circuit 10, whereby the resistor R1-R4 corresponding with the optimum cutoff frequency is selected. In a general tuning method, a sine wave of a fixed frequency is inputted to the input terminal Vin and the attenuation amount of the output signal is checked. By repeating a check of the attenuation amount of the output signal by varying the frequency of the input sine wave, the cutoff frequency can be detected. Further, the selection of the resistor group R1 to R4 is changed in accordance with the cutoff frequency thus detected and the attenuation amount of the output sine wave with respect to the input sine wave of a fixed frequency is checked again to confirm that the desired cutoff frequency has been set.

Figure 3:
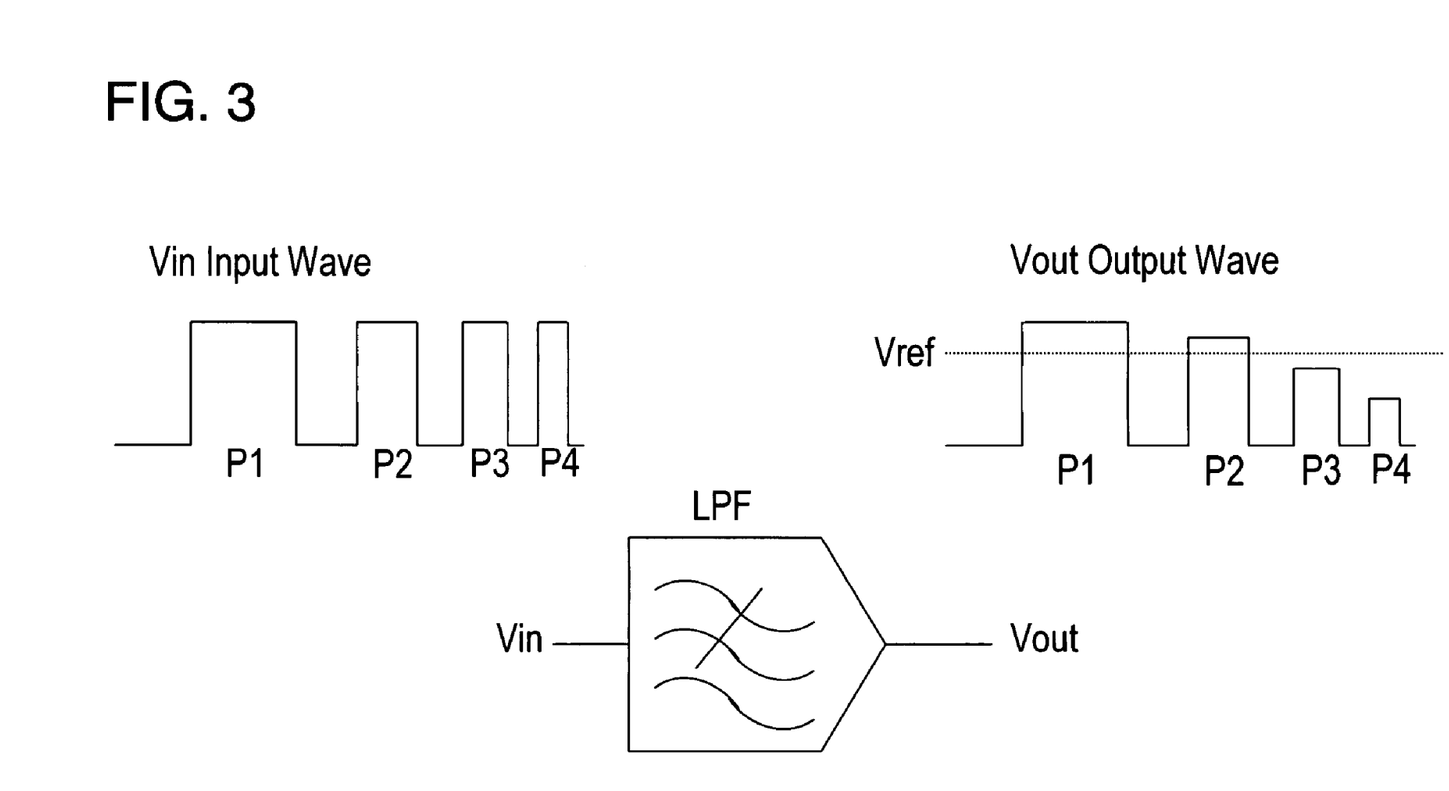
FIG. 3 illustrates a method of measuring the cutoff frequency of the filter circuit of this embodiment.

FIG. 3 illustrates a method of measuring the cutoff frequency of the filter circuit of this embodiment. In FIG. 3, a low pass filter LPF is shown as an example. According to the measurement method of this embodiment, a variable frequency pulse Vin with a frequency that increases successively is inputted as the input signal Vin of the filter circuit LPF. Further, the attenuation of the output pulse Vout with respect to the inputted variable frequency pulse is checked and the pulses P3 and P4 at or below a reference value Vref are detected. The pulses P1 to P4 of the inputted variable frequency pulse Vin have the characteristic of a sequentially increasing frequency. That is, the pulses P1 to P4 are related such that the cycles thereof change sequentially smaller. When a variable frequency pulse Vin with a successively increasing frequency is inputted to a low pass filter LPF, the pulses P1 and P2 with a low frequency are outputted without attenuation in accordance with the cutoff frequency Fc and the pulses P3 and P4 with a high frequency are attenuated to or below the reference value Vref in accordance with the cutoff frequency Fc. Therefore, by checking the position of the pulse that is attenuated to or below the reference value Vref of the output pulse, the cutoff frequency of the low pass filter LPF can be detected in a straightforward manner. When the variable frequency pulses above are inputted to a high pass filter, in the case of the pulses P1 and P2, for example, the output pulse is attenuated in accordance with the reference value Vref and, in the case of the pulses P3 and P4, the output pulse is at or above the reference value.

Further, the reference value Vref is desirably $1/\sqrt{2}$ times the amplitude value of the inputted variable frequency pulse, for example.

In the case of this embodiment, the inputted variable frequency pulse signal Vin may be such that the frequency of the pulses P1 to P4 decreases successively. That is, the pulse cycles may increase successively. In this case, when the filter is a low pass filter, the output pulse is attenuated to or below the reference value in the case of the initial pulse and is not attenuated after a predetermined number pulses. Further, the reverse is true of a high pass filter.

Further, while pulses with the same frequency or cycle are each repeated two times, the frequency of the inputted variable frequency pulse may be increased or decreased successively. Thus, the attenuation amount for a pulse with a high frequency in particular, that is, with a short cycle, can be detected at low speed by a detection circuit. However, in this case also, the cutoff frequency of the filter circuit can be detected simply by inputting one time a variable frequency pulse with a successively changing frequency or cycle.

Because the cutoff frequency can be easily detected by means of the cutoff frequency detection method of this embodiment, the selection states of the plurality of impedance elements in the filter circuit can be changed in accordance with the detected cutoff frequency and tuned to establish the desired cutoff frequency.

Figure 4:
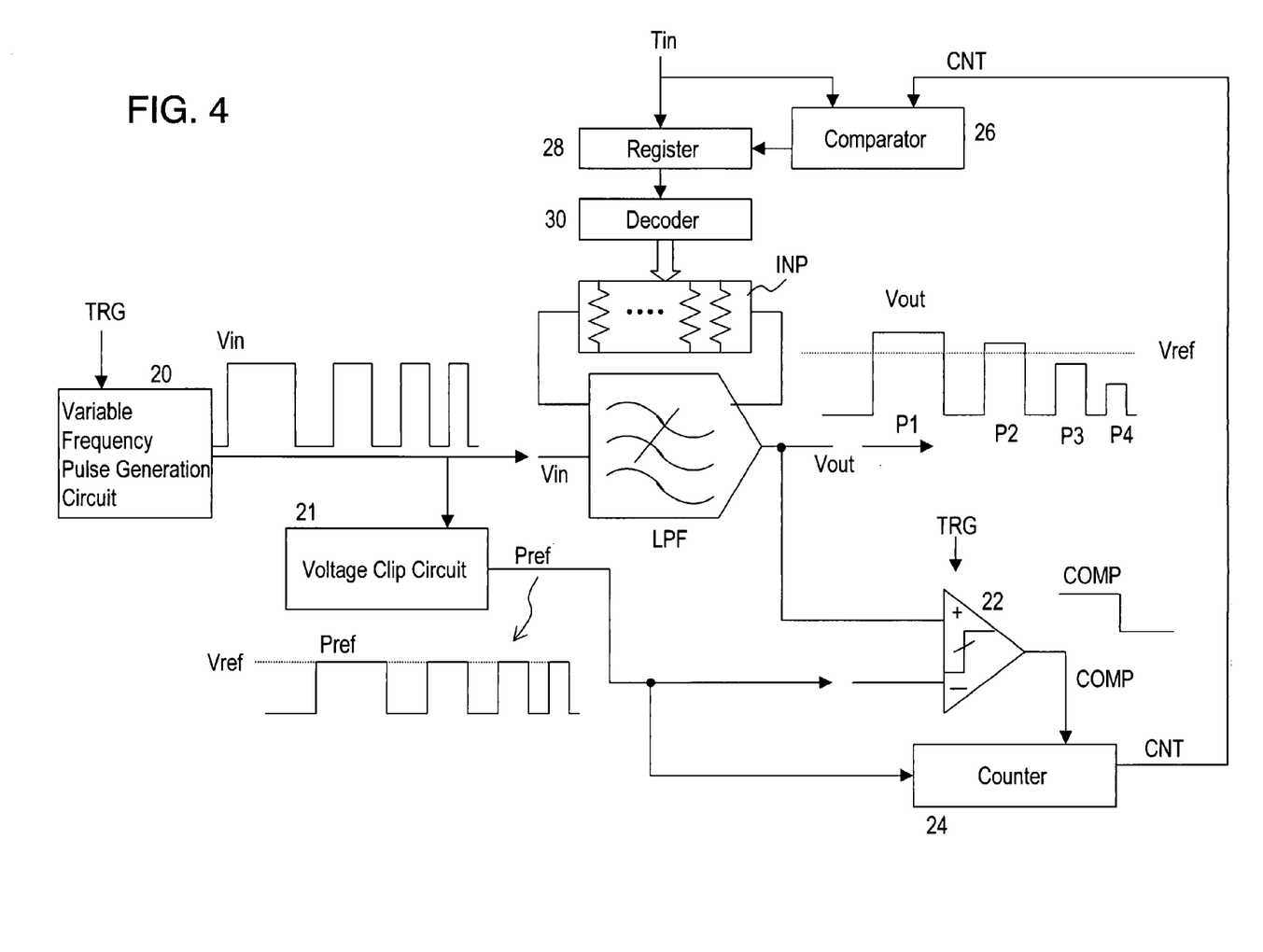
FIG. 4 shows the filter circuit with an adjustable cutoff frequency of this embodiment.

FIG. 4 shows the filter circuit with an adjustable cutoff frequency of this embodiment. Although the example of FIG. 4 is an example of a low pass filter circuit, this also applies to a high pass filter circuit. This embodiment comprises a variable frequency pulse generation circuit 20 that generates a variable frequency pulse Vin that is inputted to the low pass filter LPF. The variable frequency pulse generation circuit 20 generates a variable frequency pulse signal with a successively increasing frequency in response to a trigger signal TRG and inputs the variable frequency pulse signal to the low pass filter LPF. The variable frequency pulse signal is also supplied to a voltage clip circuit 21 and the voltage clip circuit 21 generates a reference pulse signal Pref that is rendered by setting the amplitude value of the variable frequency pulse signal Vin (voltage value) as the reference value Vref.

The impedance element group INP of the low pass filter LPF is set in an initial state by means of a select signal that is produced as a result of decoding, by means of a decoder 30, the value of a register 28 in which the desired set value Tin is stored. Suppose that the set value Tin is '3'. That is, a target value is established with which attenuation is not performed up to the third pulse of the variable frequency pulses and the fourth pulse and subsequent pulses are attenuated to or below a reference value.

Based on the initial state, the low pass filter circuit LPF outputs an output pulse signal Vout in correspondence with the inputted variable frequency pulse signal Vin. Further, a comparator 22 with a latch function compares the output pulse signal Vout and the reference pulse signal Pref and outputs a comparison result signal COMP. The output pulse signal Vout is inputted to the positive input terminal of the comparator 22 and the reference pulse signal Pref is inputted to the negative input terminal of the comparator 22. The comparator 22 renders the comparison result signal COMP a high level signal while the positive input is equal to or more than the negative input and renders the comparison result signal COMP a low level signal once the positive input is less than the negative input. This L level is latched within the comparator 22 and thereafter the comparison result signal COMP is fixed. A counter circuit 24 counts the pulses of the reference pulse Pref while the comparison result signal COMP is at the high level. In the example shown in FIG. 4, the pulses P1 and P2 of the output pulse Vout are counted and, because the comparison result signal COMP is at the low level at the time of pulse P3, the count value stops at '2'.

The count value CNT of the counter circuit 24 is compared with the set value Tin by a comparison circuit 26. Although the set value Tin is '3' as described earlier, it is confirmed that the count value CNT is '2' and that the cutoff frequency is lower than the target value. Therefore, the comparison circuit 26 rewrites the set value Tin=3 of the register 28 at count value CNT=2. The rewritten register value is decoded by means of the decoder 30 and the impedance element that corresponds with the register value=2 is selected. As a result of the selection of the impedance element, the cutoff frequency is adjusted to a higher level.

Thereafter, the variable frequency pulse signal Vin is generated by the variable frequency pulse generation circuit 20 in accordance with the trigger signal TRG once again and the comparator 22 compares the filter circuit output pulse Vout with the reference pulse Pref. The comparator 22 then resets the built-in latch circuit in response to the trigger signal TRG. Supposing that, as a result of adjusting the cutoff frequency to a higher level, the counter value CNT is '3'. The comparison circuit 26 does not change the value of the register 28 because the counter value CNT=3 and the set value Tin=3. As a result, the automatic tuning of the cutoff frequency ends.

An impedance selection unit is constituted by the voltage clip circuit 21, the comparator 22, the counter circuit 24, the comparison circuit 26, the register 28, and the decoder 30. The impedance selection unit checks the output pulse signal Vout of the low pass filter LPF and suitably selects the impedance element INP of the low pass filter LPF in accordance with the position of the pulse attenuated below the reference value Vref. That is, when the cutoff frequency of the low pass filter thus detected is too low, the impedance element is changed to raise the cutoff frequency. Conversely, when the detected cutoff frequency is too high, the impedance element is changed to lower the cutoff frequency. Thus, the impedance selection unit checks the attenuation amount of the filter output pulse with respect to the variable frequency pulse signal and optimally selects the impedance element of the filter circuit to tune the cutoff frequency.

In FIG. 4, when the filter circuit is a high pass filter, the attenuation of the output pulse signal Vout is the reverse. That is, the pulses P1 and P2 are attenuated below the reference value Vref and pulses P3 and P4 are not attenuated to the reference value Vref. Therefore, the high level and low level of the comparison result signal COMP of the comparator 22 are reversed. In this case, the inverted signal of the comparison result signal COMP may be supplied to the counter circuit 24.

In addition, in FIG. 4, when the frequency of the variable frequency pulse signal Vin decreases successively, the high level and low level of the comparison result signal COMP are reversed in the case of a low pass filter. Hence, the inverted signal must be supplied to the counter circuit 24. On the other hand, in the case of a high pass filter, the comparison result signal COMP is as shown in FIG. 4 and the comparison result signal COMP can be supplied to the counter circuit 24 as is.

Figure 5:
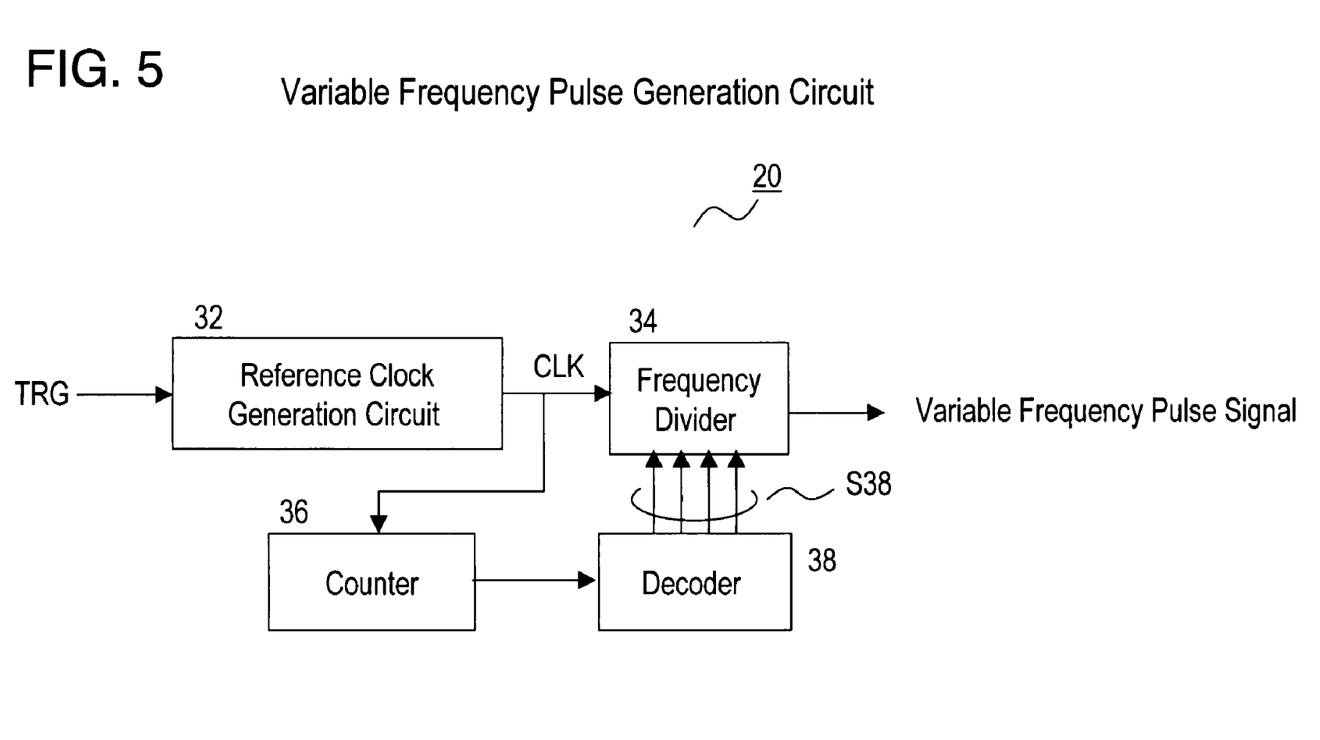
FIG. 5 shows a circuit diagram of the variable frequency pulse generation circuit of this embodiment.

FIG. 5 shows a circuit diagram of the variable frequency pulse generation circuit of this embodiment. The variable frequency pulse generation circuit 20 comprises a reference clock generation circuit 32 that generates a reference clock CLK in response to a trigger signal TRG and a frequency divider 34 that divides the reference clock CLK. The frequency divider 34 has a constitution in which a plurality of flip flops is connected in serial, for example, and switches are provided between the outputs of the respective flip flops and the output of the frequency divider, for example. The output of the flip flop that corresponds with a switch controlled to conduct by means of a decode signal S38 of a decoder 38 is outputted. Further, the counter 36 counts the reference clocks CLK and the count value is decoded by a decoder 38.

That is, the variable frequency pulse generation circuit in FIG. 5 is such that the frequency division ratio of the frequency divider 34 changes successively in accordance with an increase in the count value of the pulse of the reference clock CLK such that a variable frequency pulse signal Vin with a frequency increasing for each pulse is outputted. In a case where the frequency divider 34 has a constitution in which a plurality of flip flops is connected in serial, the frequency division ratio changes with the ratios 1/2, 1/4, 1/8, and 1/16 and the frequency increases two times, four times, eight times and sixteen times. A variable frequency pulse signal with a frequency decreasing for each pulse can also be generated by reversing the output constitution of the decoder 38.

Figure 6:
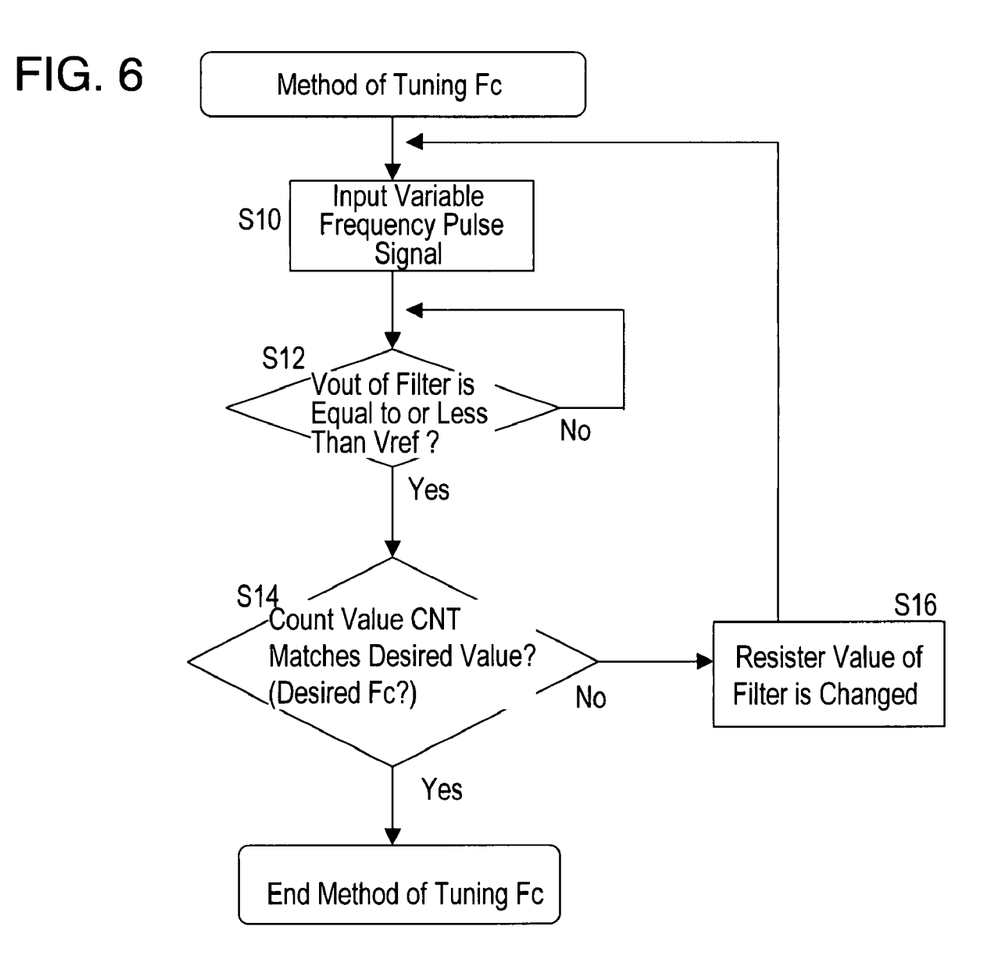
FIG. 6 is a flowchart for a method of tuning the cutoff frequency Fc of the filter circuit in FIG. 5.

FIG. 6 is a flowchart for a method of tuning the cutoff frequency Fc of the filter circuit in FIG. 5. A variable frequency pulse signal is generated and inputted to the filter circuit in response to the trigger TRG for tuning (S10). A check is then performed by means of the comparator 22 of whether the pulse voltage of the output Vout of the filter circuit is equal to or less than the reference voltage Vref (S12). When a pulse that has attenuated to or below the reference voltage Vref is detected, the cutoff frequency Fc is detected in accordance with the position (order) of the pulse. A check is then performed by the comparison circuit 26 of whether the count value CNT of the counter circuit 24 matches the desired set value Tin=3. When there is a discrepancy, the resistance value or capacitance value of the filter is changed (S16). In the event of a match, the tuning ends.

When the count value CNT does not match the set value Tin, the resistance value or capacitance value of the filter is changed. Following this change, the trigger signal TRG is controlled to be outputted by means of the comparison circuit 26, a variable frequency pulse signal is inputted to the filter circuit once again and the tuning operation is repeated in the same way as above. At such time, if the count value CNT matches the set value Tin, the tuning ends. In the event of a discrepancy, the process is repeated until a match is produced.

Figure 7:
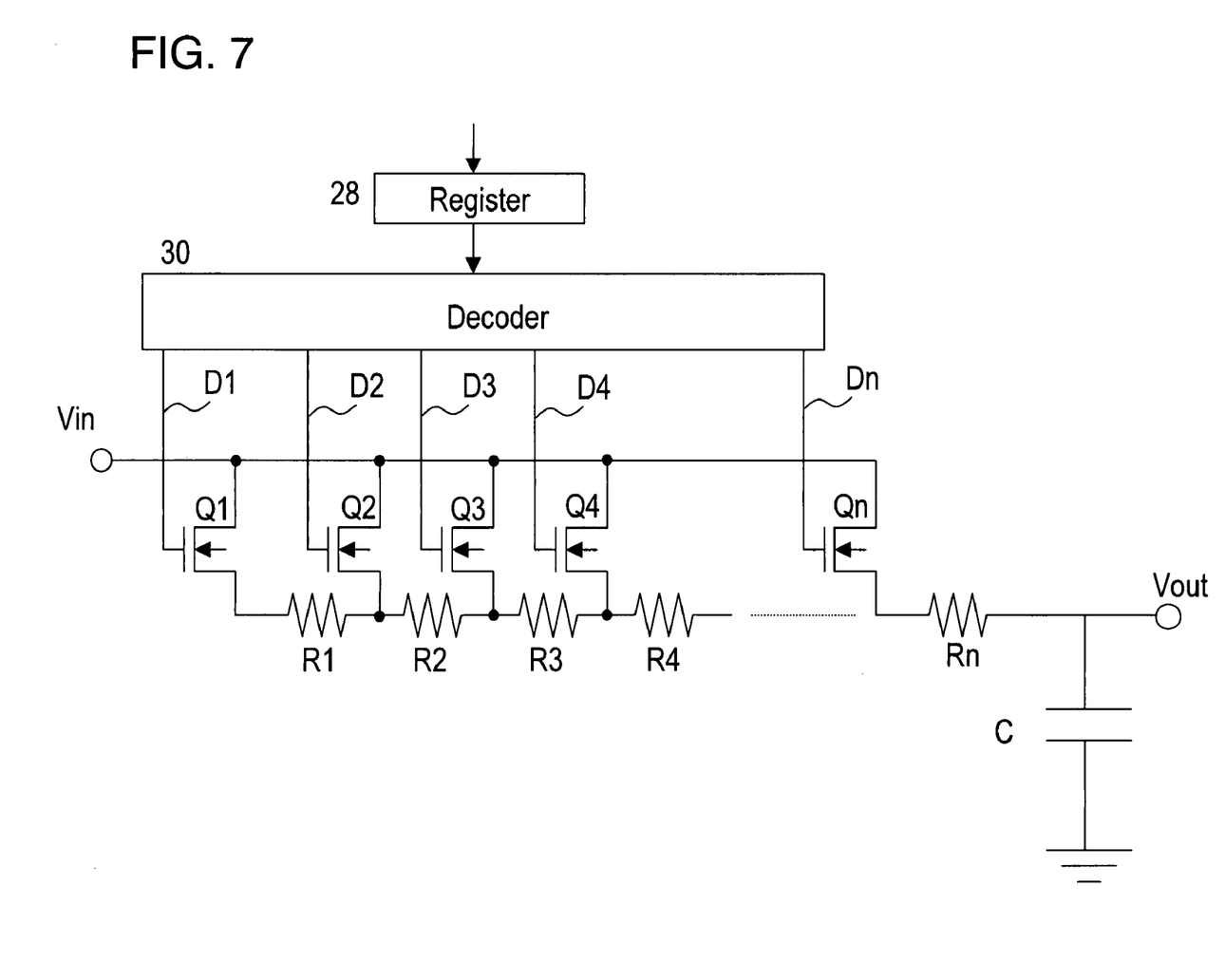
FIG. 7 is a circuit diagram of the low pass filter circuit of this embodiment.

FIG. 7 is a circuit diagram of the low pass filter circuit of this embodiment. In this circuit example, a plurality of resistor elements R1 to Rn, which are impedance elements, are provided and the plurality of resistive elements are selected by means of transistors Q1 to Qn that are controlled to conduct by means of decode signals D1 to Dn of the decoder 30. That is, only any one of the decode signals D1 to Dn is at the high level, while the other decode signals are all at the low level. As a result, only anyone of transistors Q1 to Qn conducts. For example, if the decode signal D3 is at the high level, transistor Q3 conducts and the resistance component of the low pass filter circuit is a series circuit of the resistor elements R3 to Rn. If, on the other hand, the decoder output D2 assumes the high level, transistor Q2 then conducts and the resistance values becomes higher as the resistor elements R2 to Rn and the cutoff frequency Fc=1/2pRC becomes lower. Conversely, if the decoder output D4 assumes the high level, transistor Q4 conducts and the cutoff frequency is then higher.

If this is applied to the above example, suppose that the initial set value Tin=3 is set in the register 28 and that the decoder output D3 is at the high level. In the initial state, when it is detected that the count value CNT=2 and the cutoff frequency Fc is too low, the count value CNT=2 is set in the register 28 and the decode signal D4 assumes the high level, for example. As a result, the resistance is the serial circuit of R4 to Rn and is lower and the cutoff frequency is set at a higher level.

Figure 8:
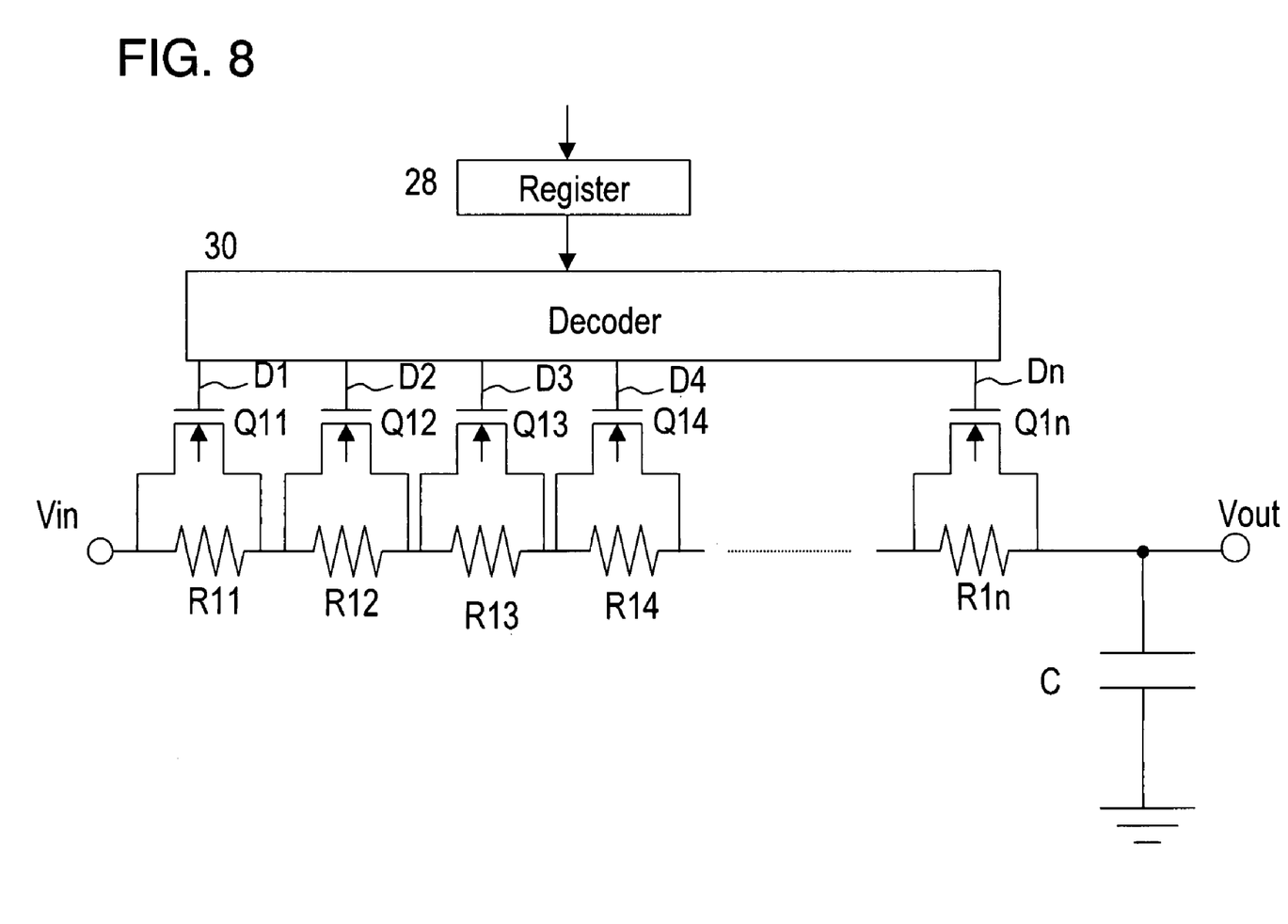
FIG. 8 is another circuit diagram of the low pass filter circuit of this embodiment.

FIG. 8 is another circuit diagram of the low pass filter circuit of this embodiment. In this circuit example, a plurality of resistor elements R11 to R1$n$ are provided as impedance elements and transistors Q11 to Q1$n$, which are controlled to conduct by means of the decoder outputs D1 to Dn of the decoder 30, are provided. The decoder 30 sets all the decoder outputs D1 to Dk (k is an integer from 1 to n) at the high level and all the decoder outputs Dk+1 to Dn to the low level in correspondence with the set value in the register 28. As a result, the series circuit of the resistors R1$k$+1 to R1$n$ is the resistance component. If the resistance component is made large, the cutoff frequency drops, and if the resistance component is made small, the cutoff frequency increases.

Figure 9:
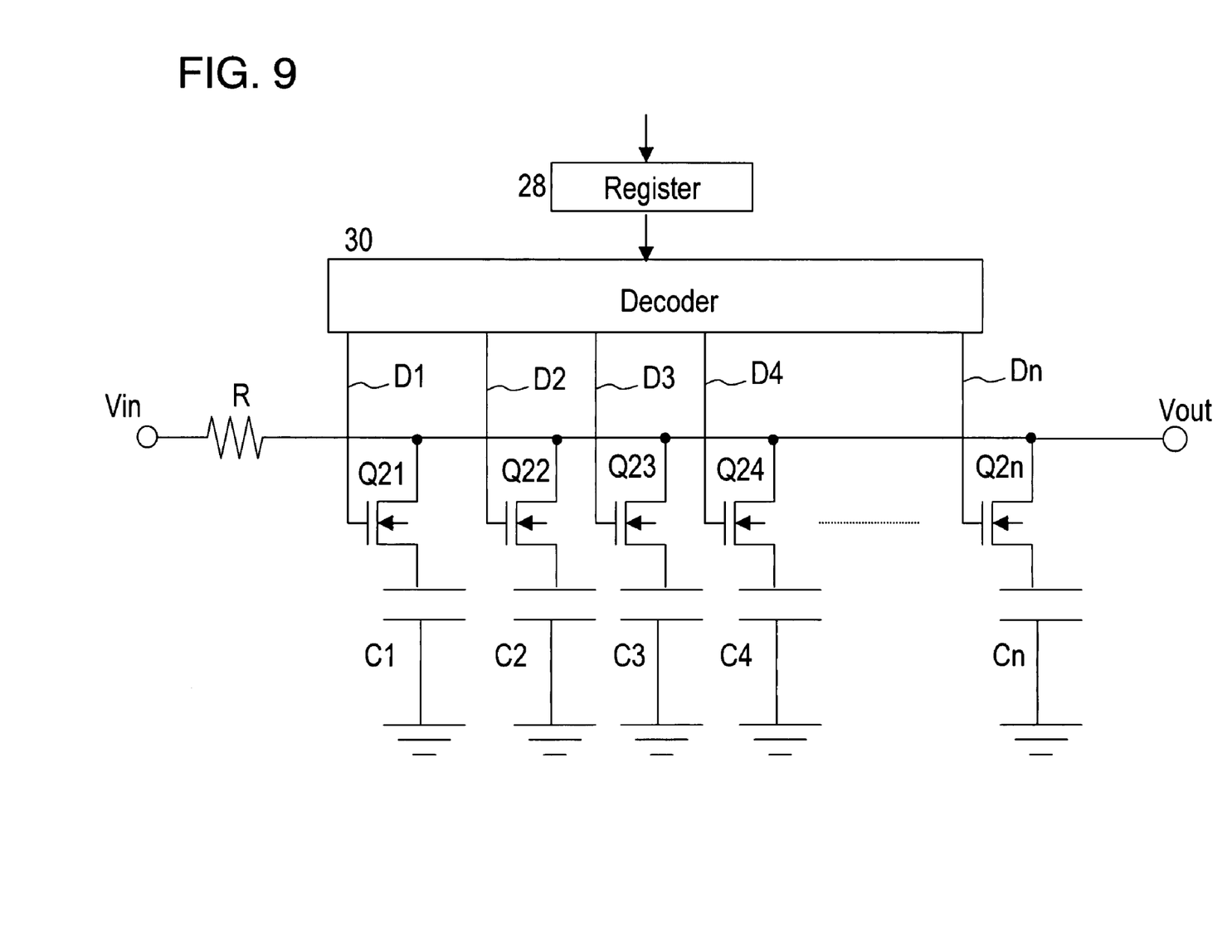
FIG. 9 is another circuit diagram of the low pass filter circuit of this embodiment.

FIG. 9 is another circuit diagram of the low pass filter circuit of this embodiment. In this circuit example, a plurality of capacitor elements C1 to Cn are provided as impedance elements and transistors Q21 to Q2$n$, which are controlled to conduct by means of the decoder outputs D1 to Dn of the decoder 30, are provided. The capacitor elements C1 to Cn have the relationship C1>C2> . . . >Cn, for example, and only one of the decoder outputs D1 to Dn is at the high level, all of the remaining decoder outputs being at the low level. For example, when the decoder output D3 assumes the high level, only the transistor Q23 conducts and only the capacitor C3 is connected. On the other hand, when the decoder output D2 assumes the high level, transistor Q22 conducts and the capacitor C2 (>C3) is connected. As a result, the cutoff frequency drops.

If this is applied to the above example, suppose that the initial set value Tin=3 is set in the register 28 and the decoder output D3 is at the high level. In the initial state, when it is detected that the count value CNT=2 and the cutoff frequency Fc is too low, the count value CNT=2 is set in the register 28 and the decode signal D4 assumes the high level, for example. As a result, the capacitor is C4 (<C3) and low and the cutoff frequency is set at a higher level.

Figure 10:
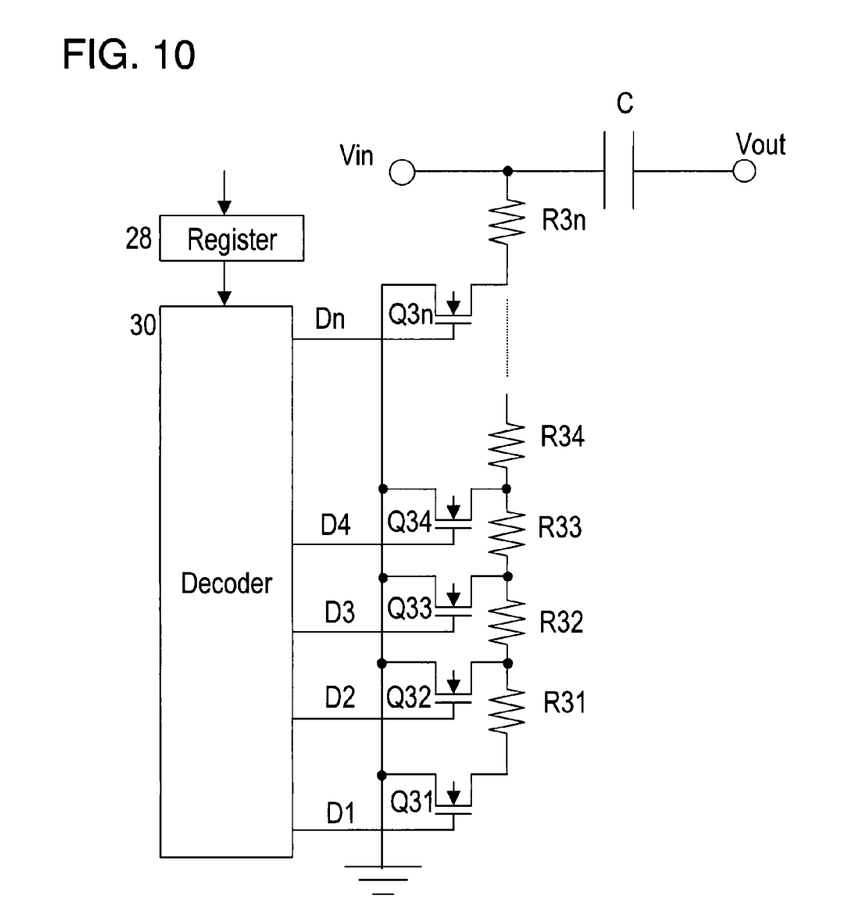
FIG. 10 is a circuit diagram of the high pass filter circuit of this embodiment.

FIG. 10 is a circuit diagram of the high pass filter circuit of this embodiment. In this circuit, a plurality of resistors R31 to R3$n$ are provided as impedance elements and transistors Q31 to Q3$n$, which are controlled by decoder outputs D1 to Dn, are provided. Only one decoder output is at the high level, while the other outputs are all at the low level. For example, when the decoder output D3 is at the high level, only transistor Q33 conducts and the series circuit of the resistors R33 to R3$n$ are the resistor component. When the decoder output D4 assumes the high level, only transistor Q34 conducts, the series circuit of the resistors R34 to R3$n$ is the resistor component, the resistor component decreases and the cutoff frequency increases. A plurality of resistor elements are also constituted such that same are selected by a transistor circuit such as that shown in FIG. 8.

Figure 11:
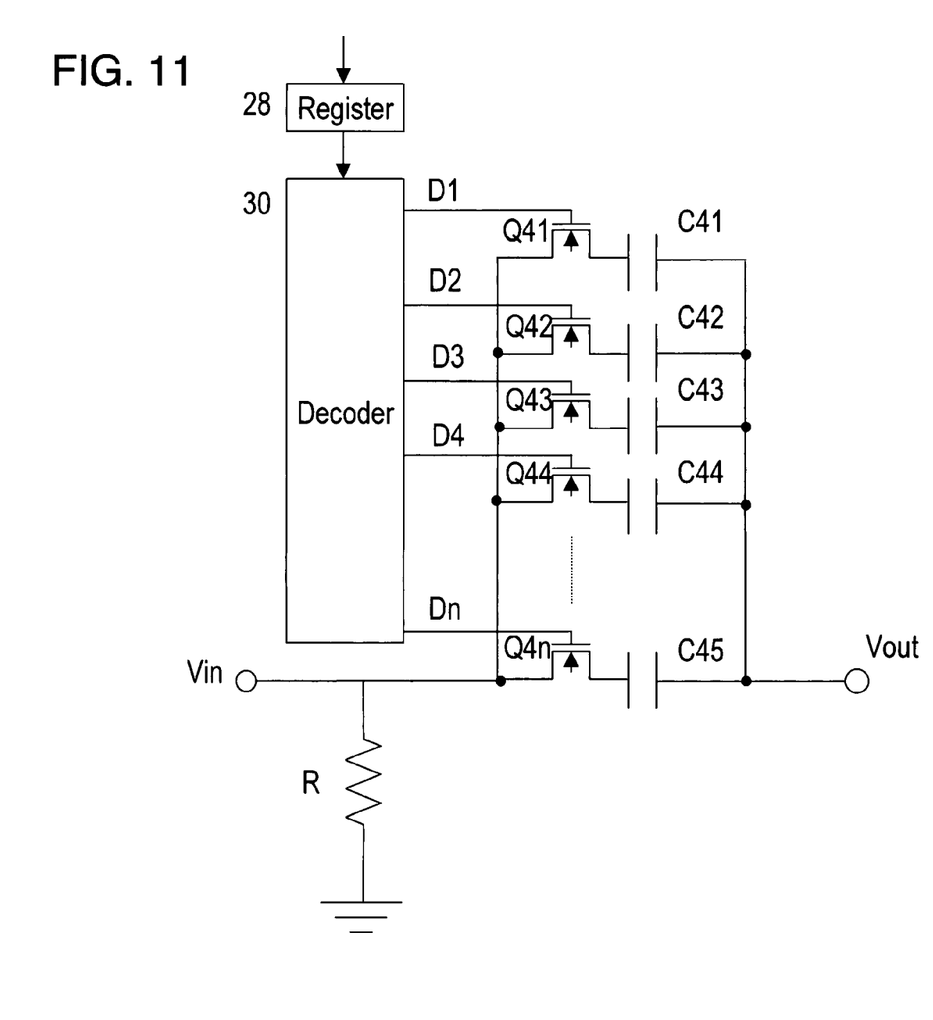
FIG. 11 is another circuit diagram of the high pass filter circuit of this embodiment.

FIG. 11 is another circuit diagram of the high pass filter circuit of this embodiment. In this circuit, a plurality of capacitor elements C41 to C4$n$ are provided as impedance elements and the transistors Q41 to Q4$n$, which are controlled to conduct by means of decoder outputs D1 to Dn of the decoder 30, are provided. The capacitor elements C41 to C4$n$ have the relationship C41>C42> . . . >C4$n$, for example, and only one of the decoder outputs D1 to Dn is at the high level, all of the remaining decoder outputs being at the low level. For example, when the decoder output D3 assumes the high level, only transistor Q43 conducts and only the capacitance C43 is connected. On the other hand, when the decoder output D2 is at the high level, the transistor Q42 conducts and the capacitance C42(>C43) is connected. As a result, the cutoff frequency drops.

According to the embodiment hereinabove, the cutoff frequency of the filter circuit can be easily detected. Further, only a variable frequency pulse signal with a successively increasing or decreasing frequency is supplied to the filter circuit in order to measure the cutoff frequency, meaning that the number of measurement steps is small. Further, the circuit that generates the pulse signal is constituted by a digital circuit, which permits lower costs than those of an analog circuit that generates a sine wave as per the prior art.

Further, according to this embodiment, by providing the filter circuit with a variable frequency pulse generation circuit and an impedance element selection unit, the cutoff frequency of the filter circuit can be tuned automatically.

In addition, in the case of the embodiment above, the cutoff frequency can be similarly detected even when a sine wave with a successively increasing or decreasing frequency is inputted to the filter circuit instead of a variable frequency pulse. In that case, the output signal of the filter circuit is also a sine wave but the amplitude value thereof is attenuated at a frequency that exceeds the cutoff frequency when the filter circuit is a low pass filter. Therefore, the cutoff frequency of the filter circuit can be detected by detecting the position at which the amplitude of the output sine wave is attenuated. Further, the filter circuit can also be tuned to the desired cutoff frequency by changing the selection of the impedance element of the filter circuit on the basis of the position at which the amplitude of the output sine wave is attenuated.

What is claimed is:

1. A filter circuit, having a plurality of selectable impedance elements, that has a cutoff frequency dependent on a selected impedance element, comprising:

a filter processing circuit that transmits a signal with a frequency range based on the cutoff frequency;

a pulse generation circuit that supplies a variable frequency pulse with a successively increasing or decreasing frequency to an input of the filter processing circuit; and an impedance element selection unit that checks an attenuation of an output pulse of the filter processing circuit corresponding with the input of the variable frequency pulse and selects the plurality of impedance elements on the basis of the position of a pulse that is attenuated to or below a reference value.

2. The filter circuit according to claim 1, wherein the impedance element is a resistor element or capacitor element.

3. The filter circuit according to claim 1, wherein the impedance element selection unit includes a comparator that compares the amplitude value of the output pulse of the filter processing circuit with a reference value, and detects a position of a pulse with which the result of the comparison by the comparator changes.

4. The filter circuit according to claim 3, wherein the impedance element selection unit generates a comparison pulse signal that is produced by rendering the amplitude value of the inputted variable frequency pulse signal the reference value and the comparator compares the amplitude value of the output pulse of the filter processing circuit with the amplitude value of the comparison pulse signal.

5. The filter circuit according to claim 1, wherein the impedance element selection unit changes the selection state of the plurality of impedance elements so as to change the cutoff frequency to the desired frequency on the basis of the detected pulse position.

6. The filter circuit according to claim 1, wherein the impedance element selection unit establishes a state where a predetermined impedance element is selected as the initial state and changes the selection state of the impedance element on the basis of a pulse, that is attenuated to or below the reference value, of the output pulse outputted in the initial state.

7. The filter circuit according to claim 1, wherein the filter processing circuit is a low pass filter that transmits a signal with a lower frequency range than the cutoff frequency and attenuates a signal with a higher frequency range than the cutoff frequency, or is a high pass filter that transmits a signal with a higher frequency range than the cutoff frequency and attenuates a signal with a lower frequency range than the cutoff frequency.

8. The filter circuit according to claim 1, wherein the variable frequency pulse comprises a plurality of pulse groups with a successively changing frequency and the pulse groups include a plurality of pulses with the same frequency.

9. A method of measuring a cutoff frequency of a filter circuit, the cutoff frequency being dependent on an internal impedance element, the method comprising the steps of:

supplying a variable frequency pulse with a successively increasing or decreasing frequency to an input of the filter circuit; and checking an attenuation of an output pulse of the filter circuit that corresponds with the input of the variable frequency pulse and detecting the cutoff frequency on the basis of the position of a pulse that is attenuated to or below a reference value.

10. The method of measuring the cutoff frequency of a filter circuit according to claim 9, wherein the filter circuit comprises a plurality of selectable impedance elements and the cutoff frequency is dependent on the selected impedance element, the method further comprising the step of:

selecting the plurality of impedance elements in accordance with the detected cutoff frequency.

11. A filter circuit, having a plurality of selectable impedance elements, that has a cutoff frequency dependent on a selected impedance element, comprising:

a filter circuit that transmits a signal with a frequency range based on the cutoff frequency;

a pulse generation circuit that supplies a variable frequency signal with a successively increasing or decreasing frequency to an input of the filter circuit; and an impedance element selection unit that checks an attenuation of an output signal of the filter circuit corresponding with the input of the variable frequency signal and selects the plurality of impedance elements on the basis of a position of the output signal that is attenuated to or below a reference value.

12. The filter circuit according to claim 11, wherein the variable frequency signal is a sine wave with a successively changing frequency or a pulse signal with a successively changing frequency.

* * * * *